(12) United States Patent
Sakamoto et al.

(10) Patent No.: US 12,095,588 B2
(45) Date of Patent: Sep. 17, 2024

(54) VEHICULAR DRAWING DEVICE

(71) Applicant: DENSO CORPORATION, Kariya (JP)

(72) Inventors: Keiya Sakamoto, Kariya (JP); Takashi Hashizume, Kariya (JP)

(73) Assignee: DENSO CORPORATION, Kariya (JP)

( * ) Notice: Subject to any disclaimer, the term of this patent is extended or adjusted under 35 U.S.C. 154(b) by 766 days.

(21) Appl. No.: 17/224,251

(22) Filed: Apr. 7, 2021

(65) Prior Publication Data

US 2021/0226813 A1    Jul. 22, 2021

Related U.S. Application Data

(63) Continuation of application No. PCT/JP2019/035710, filed on Sep. 11, 2019.

(30) Foreign Application Priority Data

Oct. 9, 2018    (JP) .................. 2018-190862

(51) Int. Cl.
| | | |
|---|---|---|
| *H04L 12/40* | (2006.01) | |
| *B60R 16/02* | (2006.01) | |
| *B60R 16/03* | (2006.01) | |
| *B60W 50/023* | (2012.01) | |
| *B60W 50/04* | (2006.01) | |
| *G01R 31/3185* | (2006.01) | |

(Continued)

(52) U.S. Cl.
CPC .............. *H04L 12/40* (2013.01); *B60R 16/03* (2013.01); *G01R 31/318558* (2013.01); *H04L 2012/40215* (2013.01); *H04L 2012/40273* (2013.01)

(58) Field of Classification Search
CPC ...................................................... H04L 12/40
See application file for complete search history.

(56) References Cited

U.S. PATENT DOCUMENTS

2015/0112510 A1*  4/2015  Tokunaga ............. G06F 1/3206
                                                                    701/1
2015/0254041 A1*  9/2015  Hoshihara ............ G06F 3/0488
                                                                    345/173

(Continued)

FOREIGN PATENT DOCUMENTS

| JP | H10129300 A | 5/1998 |
|---|---|---|
| JP | 2015-081021 A | 4/2015 |
| JP | 5832674 B2 | 12/2015 |

*Primary Examiner* — Mohamed Barakat
*Assistant Examiner* — Pameshanand Mahase
(74) *Attorney, Agent, or Firm* — Harness, Dickey & Pierce, P.L.C.

(57) ABSTRACT

A vehicular drawing device includes a first operating system, a second operating system, a first circuit block group, a second circuit block group, a first power circuit, a second power circuit, and a controller circuit. The first circuit block group is used in the first operating system. The second circuit block group is used in the second operating system. The first power circuit is configured to supply a sub power to the first circuit block group. The second power circuit is provided separately from the first power circuit, and the second power circuit is configured to supply a main power to the second circuit block group. In response to the main power being abnormal, the controller circuit is configured to (i) maintain supplying of the sub power from the first power circuit to the first circuit block group and (ii) terminate an operation of the second power circuit.

8 Claims, 9 Drawing Sheets

(51) Int. Cl.
*G06F 1/26* (2006.01)
*H02J 9/00* (2006.01)

(56) References Cited

U.S. PATENT DOCUMENTS

| | | | |
|---|---|---|---|
| 2019/0217719 A1* | 7/2019 | Zenner | B60L 58/21 |
| 2019/0308506 A1* | 10/2019 | Yamanaka | B60L 3/0092 |
| 2019/0362922 A1* | 11/2019 | Bae | H02H 1/04 |
| 2021/0005939 A1* | 1/2021 | Tajima | G01R 31/367 |

* cited by examiner

FIG. 4

| DETERMINED VOL. IN INPUT TERMINAL 14 | DETERMINED VOL. IN INPUT TERMINAL 15 | DETERMINED VOL. IN INPUT TERMINAL 16 | POWER STATE | OPERATION STATE OF INTEGRATED DRAWING ECU |
|---|---|---|---|---|
| L | L | L/H | — | POWER OFF |
| L | H | L | SUB POWER ABNORMAL, MAIN POWER ABNORMAL | TEMPORARY WAKE-UP/ SAFETY USE OPERATING |
| L | H | H | SUB POWER ABNORMAL | TEMPORARY WAKE-UP/ FULL OPERATING |
| H | L | L | MAIN POWER ABNORMAL (ENGINE OFF) | TEMPORARY WAKE-UP/ SAFETY USE OPERATING |
| H | L | H | NORMAL (ENGINE OFF) | TEMPORARY WAKE-UP/ FULL OPERATING |
| H | H | L | MAIN POWER ABNORMAL (ENGINE ON) | TEMPORARY WAKE-UP/ SAFETY USE OPERATING |
| H | H | H | NORMAL (ENGINE ON) | TEMPORARY WAKE-UP/ FULL OPERATING |

VEHICULAR DRAWING DEVICE

CROSS REFERENCE TO RELATED APPLICATIONS

The present application is a continuation application of International Patent Application No. PCT/JP2019/035710 filed on Sep. 11, 2019, which designated the U.S. and claims the benefit of priority from Japanese Application No. 2018-190862 filed on Oct. 9, 2018. The entire disclosures of all of the above applications are incorporated herein by reference.

TECHNICAL FIELD

The present disclosure relates to a vehicular drawing apparatus.

BACKGROUND

Vehicles (for example, automobiles) are equipped with many electronic control units (ECUs). These electronic control units perform various controls in cooperation with others. Some of these electronic control units are used to improve safety in operations. Those electronic control units need to maintain their operations by the power from the auxiliary battery via the sub power line, even if an abnormality occurs in the vehicle battery or the main power line from the vehicle battery. That is, some electronic control units mounted on the vehicle need to be maintained in operation by the power supplied from the sub power even when the main power is abnormal.

There is proposed a vehicular drawing device to diversify the information presented to the passenger by switching information on safety use and information on comfort use to draw both in combination. For example, the information on safety use includes information on meter displays, information on sensors and communications for automatic driving, and information on warnings. The information on comfort use includes information on TVs and information on applications linked to smartphones held by passengers.

SUMMARY

According to an example of the present disclosure, a vehicular drawing device is provided to include a first operating system, a second operating system, a first circuit block group, a second circuit block group, a first power circuit, a second power circuit, and a controller circuit. The second circuit block group is used in the second operating system. The first power circuit is configured to supply a sub power to the first circuit block group. The second power circuit is provided separately from the first power circuit, and the second power circuit is configured to supply a main power to the second circuit block group. The controller circuit is configured to (i) maintain supplying of the sub power from the first power circuit to the first circuit block group and (ii) terminate an operation of the second power circuit, in response to the main power being abnormal.

BRIEF DESCRIPTION OF DRAWINGS

The objects, features, and advantages of the present disclosure will become more apparent from the following detailed description made with reference to the accompanying drawings. In the drawings:

FIG. 4 is a diagram showing a state specifying table;

DETAILED DESCRIPTION

Figure 1:
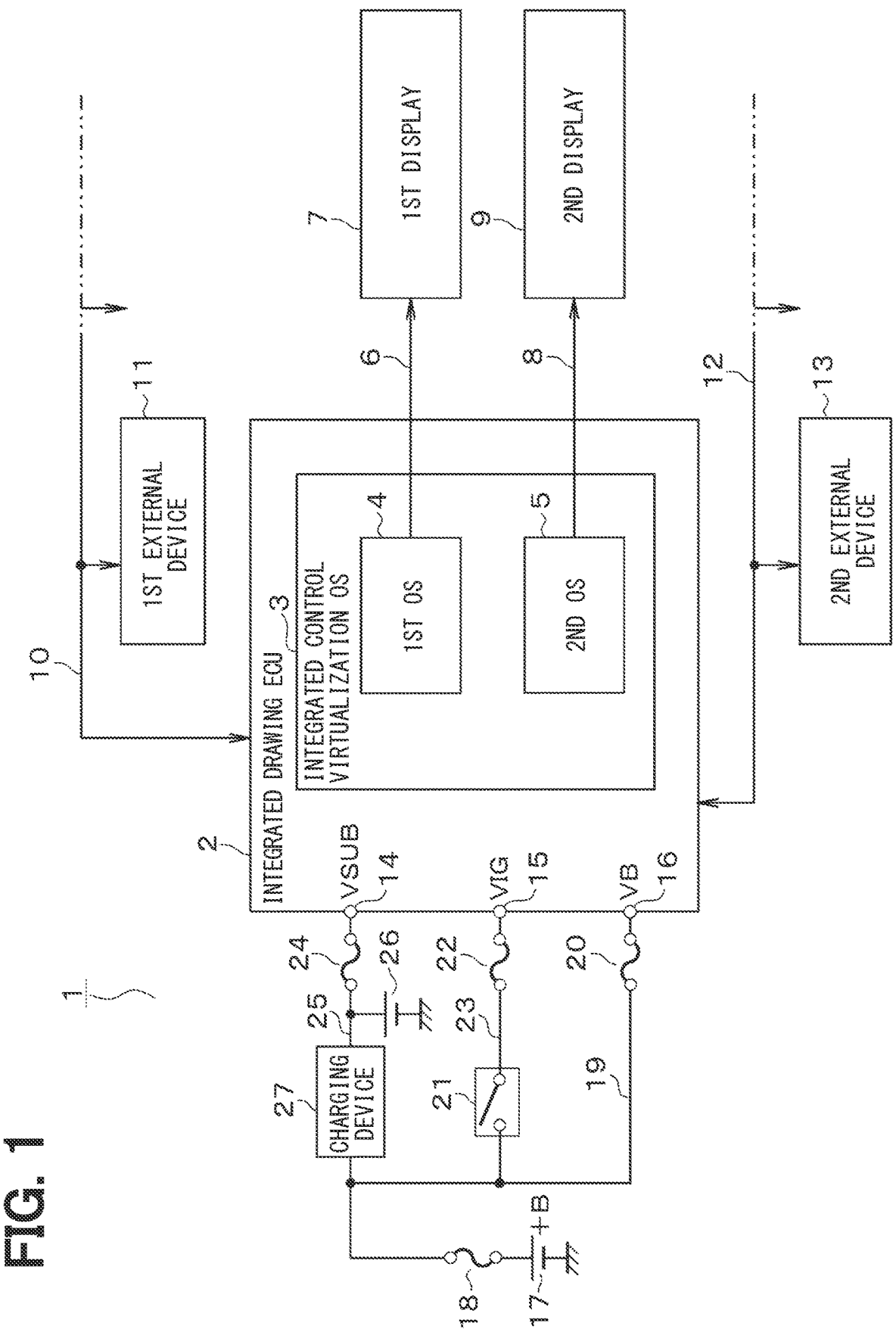
FIG. 1 is a diagram showing one embodiment and showing an integrated drawing ECU and a peripheral configuration.

Hereinafter, an embodiment of the present disclosure will be described with reference to the drawings. As shown in FIG. 1, the vehicular drawing system 1 mounted on a vehicle (for example, an automobile) includes an integrated drawing ECU 2 (vehicular drawing device). The integrated drawing ECU 2 includes an integrated control virtualization OS 3 for performing integrated control of a function for safety use and a function for comfort use. Here, OS signifies operating system. The integrated control virtualization OS 3 includes a first OS 4 that provides functions for safety use and a second OS 5 that provides functions for comfort use. As an example, in the present embodiment, the integrated control virtualization OS 3 including the first OS 4 and the second OS 5 is provided as software programs stored in a memory included in a processor 32, which will be described later.

The first OS 4, which is an OS having a function of drawing information on safety use as a function for safety use, is configured to process mainly information on safety use such as information on meter display, information on sensors and communication for automatic driving, and information on warning. The first OS 4 employs an OS having excellent high-speed activation and operation reliability. The second OS 5, which is an OS having a function of drawing information for comfort use as a function for comfort use, is configured to process mainly information for comfort use such as information on television and information on application linked with a smartphone held by a passenger. The second OS 5 employs an OS having an excellent human interface.

A first display 7 is connected to the integrated drawing ECU 2 via a first signal line 6, and a second display 9 is connected to the integrated drawing ECU 2 via a second signal line 8. For example, the first display 7 is a meter display arranged in a meter device. The first display 7 receives a video signal from the integrated drawing ECU 2 via the first signal line 6, and draws information on safety use specified by the video signal. The second display 9 is, for example, a center display arranged on the center console in the vehicle interior. The second display 9 receives a video signal from the integrated drawing ECU 2 via the second signal line 8, and draws information on comfort use specified by the video signal. Each of the first display 7 and the second display 9 does not have a function of controlling the image to be displayed by itself. Each draws information by receiving a video signal from the integrated drawing ECU 2; namely the displayed video is controlled by the integrated drawing ECU 2.

The integrated control virtualization OS 3 manages and controls the video signal output from the first OS 4 to the first display 7, and manages and controls the information on safety use drawn by the first display 7. The integrated control virtualization OS 3 manages and controls the video signal output from the second OS 5 to the second display 9, and manages and controls the information on comfort use drawn by the second display 9.

The integrated drawing ECU 2 is connected with a first external device 11 via an in-vehicle LAN (Local Area Network) 10, and is connected with a second external device 13 via a USB (Universal Serial Bus) cable 12. The in-vehicle LAN 10 is a transmission medium for transmitting highly important information related to safety use, such as CAN (Controller Area Network, registered trademark) and LIN (Local Interconnect Network). The number of each of the first external device 11 and the second external device 13 is optional. The communication signals between the integrated drawing ECU 2 and each of the first external device 11 and the second external device 13 are optional. The number of the communication signals is optional.

Next, the power line connected to the integrated drawing ECU 2 will be described. The integrated drawing ECU 2 is provided with three input terminals 14 to 16 as terminals for receiving power from the outside. A fuse 18 is connected to the vehicle battery 17 mounted on the vehicle, and the vehicle battery 17 is connected to the main power line 19 via the fuse 18. A fuse 20 is connected between the main power line 19 and the input terminal 16. In the state where the fuses 18 and 20 are attached, the output voltage+B of the vehicle battery 17 is applied to the input terminal 16 as a voltage VB via the fuses 18 and 20 regardless of the on/off state of the key switch 21 described later. The power of the voltage VB applied to the input terminal 16 is referred to as a main power. That is, the main power is the power supplied to the integrated drawing ECU 2 regardless of the on/off state of a key switch 21.

The input terminal 15 is connected to the sub power line 23 via a fuse 22. The key switch 21 is connected between the main power line 19 and the sub power line 23. When the fuses 18 and 22 are attached, the output voltage+B of the vehicle battery 17 is applied to the input terminal 15 as a voltage VIG via the fuse 18, the key switch 21, and the fuse 22. The power of the voltage VIG applied to the input terminal 15 is referred to as an ignition power. That is, the ignition power is a power that is turned on and off by operating the key switch 21 and is supplied to the integrated drawing ECU 2 at the position where the key switch 21 is "ON" or "START". The ignition is not limited to a vehicle having an internal combustion engine, and includes, for example, a ready-on or power-on which indicates a start preparation state of an electric vehicle (EV: Electric Vehicle) or a hybrid vehicle (HV: Hybrid Vehicle). In the present embodiment, the powers linked to these states are collectively referred to as ignition power.

The input terminal 14 is connected to the sub power line 25 via a fuse 24. An auxiliary battery 26 is connected to the sub power line 25. A charging device 27 is connected between the main power line 19 and the sub power line 25, and the charging device 27 charges the auxiliary battery 26 with the output voltage+B of the vehicle battery 17. When the fuse 24 is attached, an operation assisting voltage from the auxiliary battery 26 is applied to the input terminal 14 as a voltage VSUB via a fuse 24. The power of the voltage VSUB applied to the input terminal 14 is referred to as a sub power. That is, the sub power is a power that is supplied to the integrated drawing ECU 2 regardless of whether the key switch 21 is turned on or off if the auxiliary battery 26 is charged with a voltage for assisting operation.

The sub power line 25 to the input terminal 14 and the sub power line 23 to the input terminal 15 each include a line having a relatively small current allowance. The main power line 19 to the input terminal 16 includes a line having a relatively large current allowance.

Figure 2:
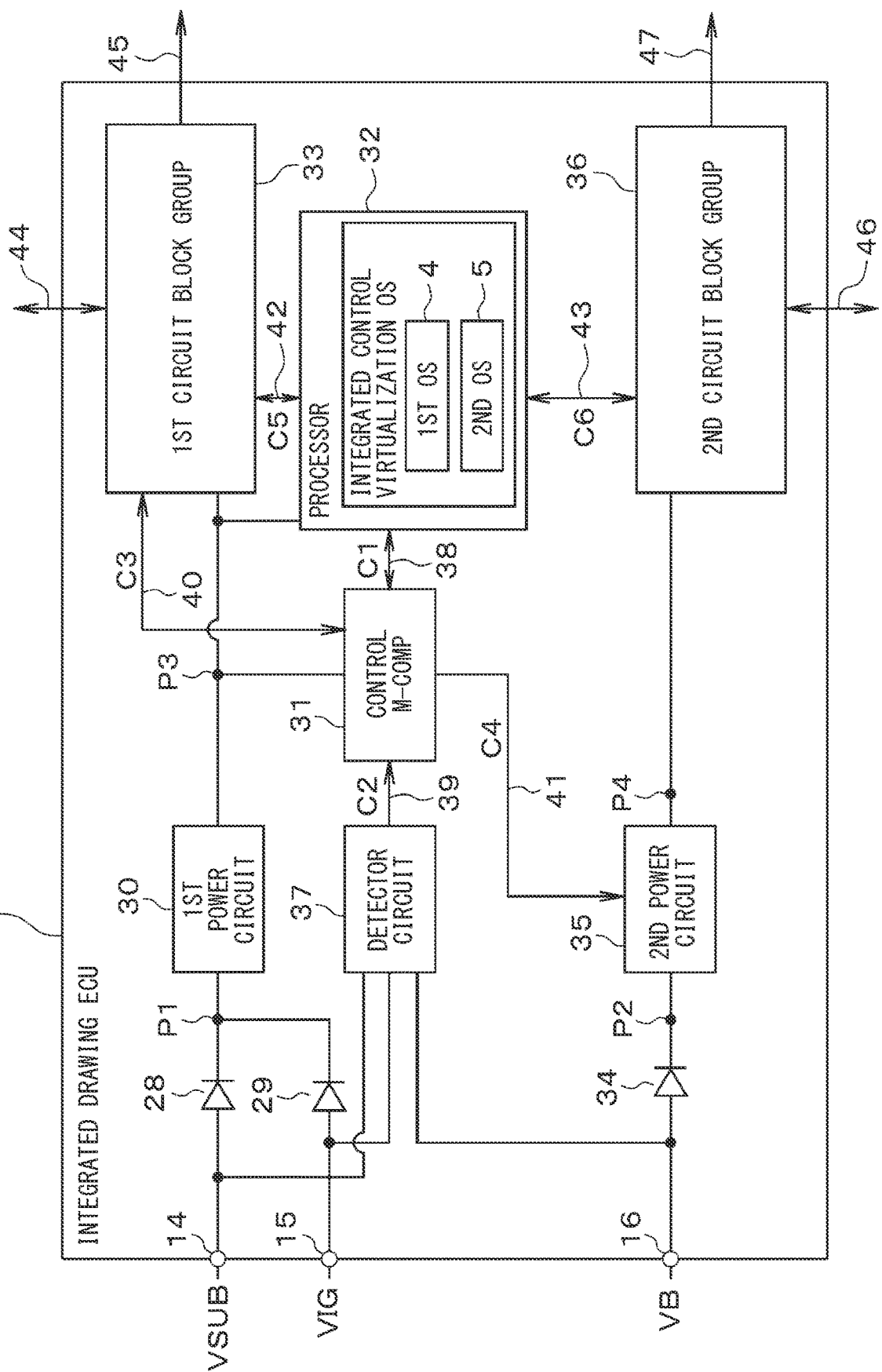
FIG. 2 is a circuit block configuration diagram of an integrated drawing ECU.

Next, the internal configuration of the integrated drawing ECU 2 will be described. As shown in FIG. 2, the input terminals 14 and 15 are connected to the power node P1 as an OR circuit via diodes 28 and 29, respectively, for preventing backflow. The diodes 28 and 29 may be omitted as needed.

The first power circuit 30 converts the current supplied from the power node P1 into a predetermined power voltage, and supplies the converted current with the predetermined power voltage to the power node P3. The power node P3 supplies the current with the predetermined power voltage to the control microcomputer 31 (which may also be referred to as a controller circuit or controller), the processor 32, and the first circuit block group 33. The first circuit block group 33 is a circuit block group used in the first OS 4, and is a circuit block group that provides functions for safety use.

The input terminal 16 is connected to the power node P2 via a diode 34 for preventing backflow. Like the diodes 28 and 29, the diode 34 may be omitted as needed.

The second power circuit 35 is provided to be arranged or located separately from the first power circuit 30. The current supplied from the power node P2 is converted into a predetermined power voltage, and the converted current with the predetermined power voltage is supplied to the power node P4. The power node P4 supplies the current with the predetermined power voltage to the second circuit block group 36. The second circuit block group 36 is a circuit block group used in the second OS 5, and is a circuit block group that provides functions for comfort use.

The detector circuit 37 (which may also be referred to as a detector) includes an operational amplifier, a comparator, and other analog circuits. The detector circuit 37 detects each voltage applied to the input terminals 14 to 16, makes a low determination or a high determination, and outputs the detection result to the control microcomputer 31 by the communication C2 via the second communication line 39. The detector circuit 37 may employ an OR circuit or an AND circuit, as needed, to minimize the number of signals to the control microcomputer 31. Further, the detector circuit 37 may perform low determination or high determination with hysteresis or may be performed with a single threshold value.

The first circuit block group 33 receives information of high importance related to safety use from the outside via the first external communication line 44, and the received information is output to the control microcomputer 31 by the communication C3 via the third communication line 40.

The control microcomputer 31 monitors the detection result from the detector circuit 37 by the communication C2, and also monitors the information from the first circuit block group 33 by the communication C3. The control microcomputer 31 outputs a control signal to the processor 32 by the communication C1 via the first communication line 38, and controls the operation of the processor 32. The control microcomputer 31 outputs a control signal to the first circuit block group 33 by the communication C3, and controls the operation of the first circuit block group 33. The control microcomputer 31 outputs a control signal to the second power circuit 35 by the communication C4 via the fourth communication line 41, and controls the operations of the second power circuit 35.

The processor 32 includes an integrated drawing function for integrally drawing video data to be processed in the first OS 4 and the second OS 5. When the processor 32 inputs an activation request from the control microcomputer 31 by the communication C1, the processor 32 starts the activation process. When the activation process is completed, status information (for example, information such as the detection result of the power line, the operating state of the first OS 4 and the second OS 5) is communicated with the control microcomputer 31 by the communication C1. Further, the processor 32 starts the termination process when the termination request is input from the control microcomputer 31 by the communication C1.

The processor 32 outputs a control signal to the first circuit block group 33 by the communication C5 via the fifth communication line 42, and controls the operation of the first circuit block group 33. That is, the processor 32 controls the operations of the first circuit block group 33, such as drawing of information on safety use, performing of external communication in the first circuit block group 33 via the first external communication line 44, and outputting of video signals from the first circuit block group 33 via the first video signal output line 45. The processor 32 outputs a control signal to the second circuit block group 36 by the communication C6 via the sixth communication line 43, and controls the operations of the second circuit block group 36. That is, the processor 32 controls the operations of the second circuit block group 36, such as drawing of information on comfort use, performing of external communication in the second circuit block group 36 via the second external communication line 46, and outputting of video signals from the second circuit block group 36 via the second video signal output line 47.

The processor 32 is configured to layer or locate the first OS 4 always above the second OS 5 and cause the first OS 4 to monitor the state of the second OS 5. When the first OS 4 detects an abnormality in program or security in the second OS 5, only the second OS 5 can be re-activated as needed. Further, the processor 32 may be configured to be accompanied by a dedicated PMIC (Power Management Integrated Circuit) for power management, if necessary, such that the PMIC communicates with the control microcomputer 31.

The signals that the control microcomputer 31 communicates with the peripheral functional blocks in the above configuration are shown below. The signal output by the detector circuit 37 to the control microcomputer 31 by the communication C2 is a signal indicating the detection result of low determination or high determination of each voltage applied to the input terminals 14 to 16.

The signals output by the control microcomputer 31 to the processor 32 by the communication C1 are control signals for controlling the operations of the processor 32. The signals output by the processor 32 to the control microcomputer 31 by the communication C1 are signals controlled by the first OS 4, such as a signal indicating the state of the first OS 4, a signal indicating the state of the second OS 5, and a signal (for example, a watch dock signal, etc.) for detecting an abnormality of the first OS 4 in terms of hardware. If the processor 32 is configured to be accompanied by the PMIC, a signal is also included which indicates the result of state detection and enabling of the PMIC.

The signals output by the first circuit block group 33 to the control microcomputer 31 by the communication C3 are a signal for notifying of information communicated via the first external communication line 44, and a signal for notifying of the status of the communication IC inside the first circuit block group 33. The signals output by the control microcomputer 31 to the first circuit block group 33 by the communication C3 are control signals for controlling the operations of the first circuit block group 33. The signals output by the control microcomputer 31 to the second power circuit 35 by the communication C4 are control signals for controlling the operations of the second power circuit 35.

Figure 3:
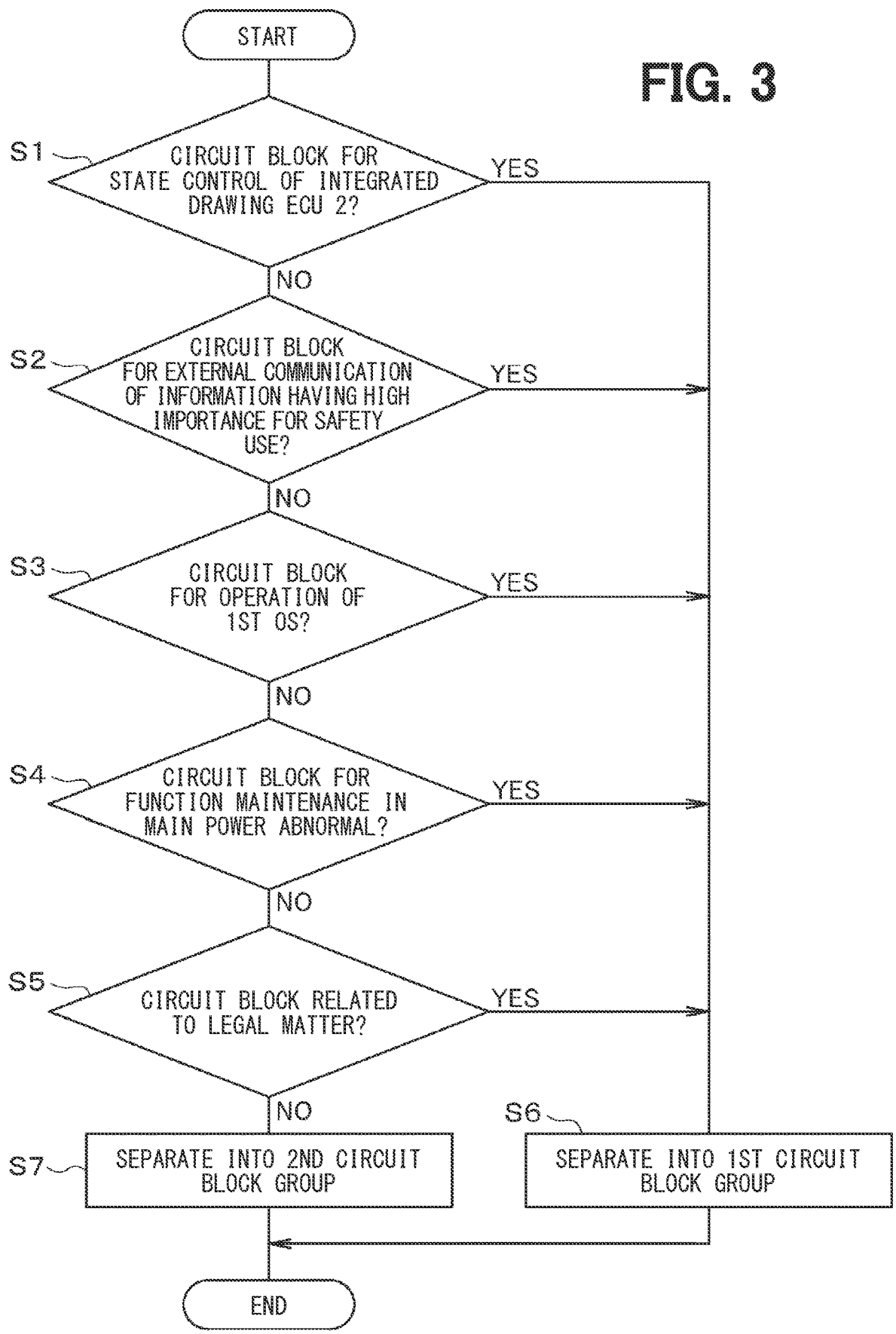
FIG. 3 is a diagram showing a determination process for separating circuit blocks when designing a product.

In designing the integrated drawing ECU 2, it is necessary to separate or classify the circuit blocks into either the first circuit block group 33 or the second circuit block group 36 according to the property. Hereinafter, a procedure for determining whether to separate the circuit blocks into the first circuit block group 33 or the second circuit block group 36 at the time of product design will be described with reference to FIG. 3.

In the first determination, it is determined whether or not a circuit block is for state control of the integrated drawing ECU 2 (S1). That is, the circuit blocks and the like around the control microcomputer 31 that controls the entire integrated drawing ECU 2 correspond to the circuit blocks for state control of the integrated drawing ECU 2. Therefore, the corresponding circuit block is separated into the first circuit block group 33 (S6).

In the second determination, it is determined whether or not the circuit block is for external communication of information having a high importance for safety use (S2). That is, circuit blocks related to meter operation such as CAN and LIN, circuit blocks related to sensors for automatic driving and communication, etc. correspond to circuit blocks for external communication of information having high importance for safety use. Therefore, the corresponding circuit block is separated into the first circuit block group 33 (S6).

In the third determination, it is determined whether or not the circuit block is necessary for the operation of the first OS 4 (S3). That is, a circuit block or the like that notifies the passenger of a function for safety use by drawing or voice output corresponds to a circuit block necessary for the operation of the first OS 4. Therefore, the corresponding circuit block is separated into the first circuit block group 33 (S6).

In the fourth determination, it is determined whether or not the circuit block needs to maintain its function when the main power is abnormal (S4). That is, if the circuit block itself is not required by the first OS 4 or the control microcomputer 31, but required for information used for automatic operation or the like corresponds to a circuit block needed to maintain its function when the main power is abnormal. Therefore, the corresponding circuit block is separated into the first circuit block group 33 (S6). For example, GPS position information, acceleration sensor information, and the like may be used for automatic driving as information for specifying the current vehicle position.

In the fifth determination, it is determined whether or not the circuit block is related to a legal matter (S5). That is, a circuit block or the like that needs to display some information according to legal requirements corresponds to a circuit block related to a legal matter. Therefore, the corresponding circuit block is separated into the first circuit block group 33 (S6). For example, a circuit block for a rear camera related to the KT (Kids and Transportation) law corresponds to the circuit block related to a legal matter.

The other circuits are separated into the second circuit block group 36 by an exclusive method (S7). According to the above procedure, the circuit block used in the first OS 4 is separated into the first circuit block group 33, and the circuit block used in the second OS 5 is separated into the second circuit block group 36.

Figure 5:
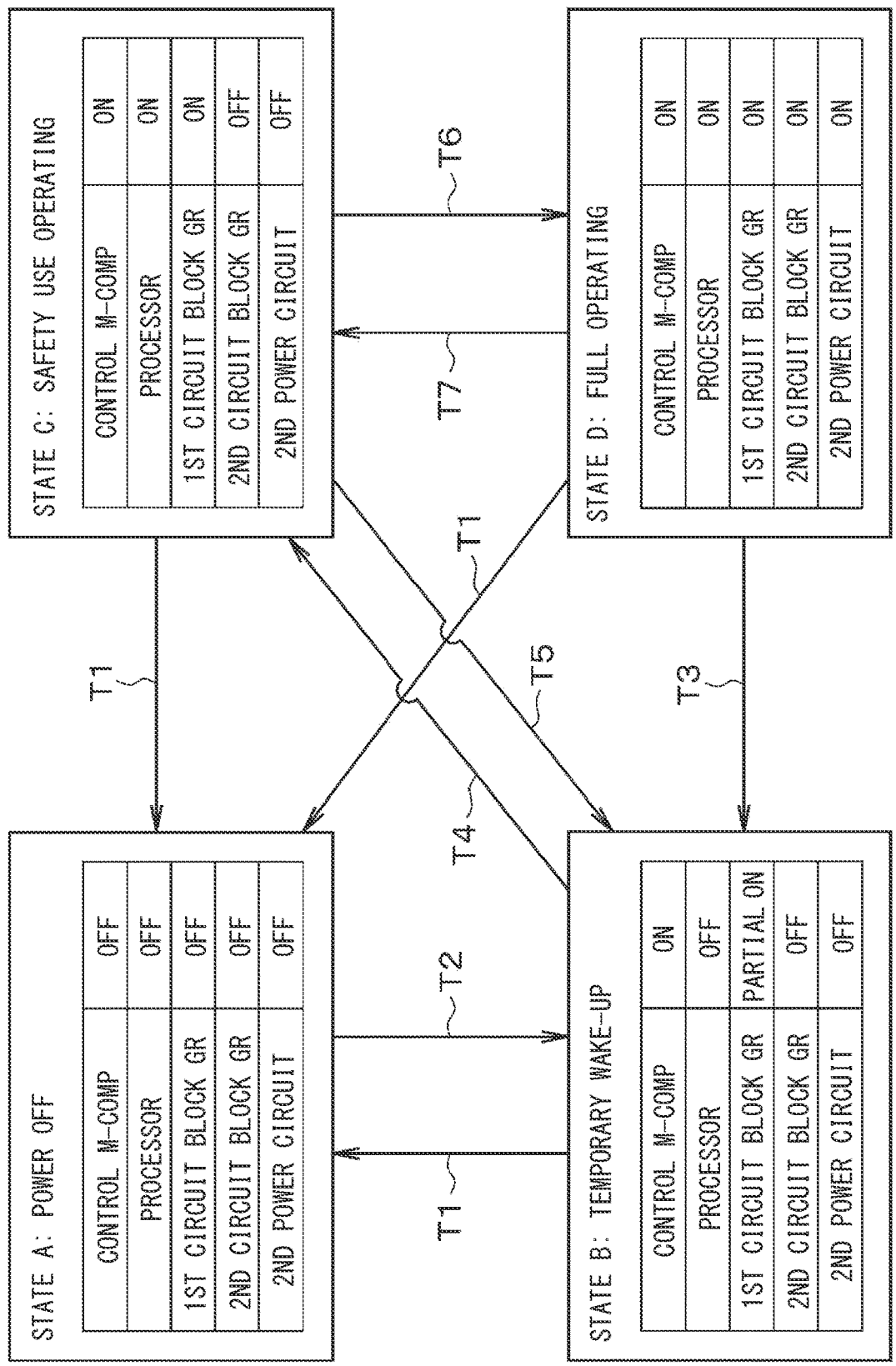
FIG. 5 is a state transition diagram.

Next, the transition of the operating state of the integrated drawing ECU 2 will be described with reference to FIGS. 4 and 5. FIG. 4 is a state specifying table for specifying the power state and the operating state of the integrated drawing ECU 2 according to the detection result of each voltage applied to each of the input terminals 14 to 16. FIG. 5 is a state transition diagram showing a transition of the operating state of the integrated drawing ECU 2. The integrated drawing ECU 2 not only changes the state when the power state changes, but also changes the state at the activation or termination by the software.

Suppose that the input terminal 14 is determined to be low, the input terminal 15 is determined to be high, and the input terminal 16 is determined to be low. In this case, the sub power is abnormal, and the main power is abnormal due to the vehicle battery 17 running out or the main power line 19 being disconnected, but the engine is turned on. That is, since the vehicle may travel, it is necessary to operate the function for safety use. This state is a special state in which the sub power is also abnormal, so that the function may be narrowed down, such as operating only the meter display function, if necessary.

Suppose that the input terminal 14 is determined to be low, the input terminal 15 is determined to be high, and the input terminal 16 is determined to be high. In this case, only the sub power is abnormal. In this case, since power can be supplied to the input terminal 16, full operation of both safety use functions and comfort use functions is possible. However, since the sub power is abnormal, the passenger may be warned that the sub power is abnormal by LED, video, voice notification, or the like.

Suppose that the input terminal 14 is determined to be high, the input terminal 15 is determined to be low, and the input terminal 16 is determined to be low. In this case, the main power is abnormal due to the vehicle battery 17 running out or the main power line 19 being disconnected, and the engine is turned off.

Suppose that the input terminal 14 is determined to be high, the input terminal 15 is determined to be low, and the input terminal 16 is determined to be high. In this case, both the main power and the sub power are in a normal state (usual state), and the engine is turned off.

Suppose that the input terminal 14 is determined to be high, the input terminal 15 is determined to be high, and the input terminal 16 is determined to be low. In this case, the main power is abnormal due to the vehicle battery 17 running out or the main power line 19 being disconnected, and the engine is turned on.

Suppose that the input terminal 14 is determined to be high, the input terminal 15 is determined to be high, and the input terminal 16 is determined to be high. In this case, both the main power and the sub power are in a normal state, and the engine is turned on.

In FIG. 5, the state A is a power-off state in which the entire system is turned off. That is, the control microcomputer 31 is turned off, the processor 32 is turned off, the first circuit block group 33 is turned off, the second circuit block group 36 is turned off, and the second power circuit 35 is turned off. In the state A, no current is supplied from the input terminals 14 and 15, so the entire system is turned off.

The state B is a temporary wake-up state in which the integrated drawing ECU 2 is waiting for activation. That is, the control microcomputer 31 is turned on, the processor 32 is turned off, a part (the part related to communication) of the first circuit block group 33 is turned on, the second circuit block group 36 is turned off, and the second power circuit 35 is turned off. In the state B, it is possible to transition to each state by using an activation request from communication, an activation request from a passenger, ACC on, or the like as a trigger while suppressing unnecessary power consumption.

The state C is a safety use operating state in which only the safety use function is operating. That is, the control microcomputer 31 is turned on, the processor 32 is turned on, the first circuit block group 33 is turned on, the second circuit block group 36 is turned off, and the second power circuit 35 is turned off. In the state C, the processor 32 and the first circuit block group 33 are turned on, and the passenger can be provided with the function for safety use even when the main power is abnormal.

The state D is a full operating state in which both the function for safety use and the function for comfort use are operating. That is, the control microcomputer 31 is turned on, the processor 32 is turned on, the first circuit block group 33 is turned on, the second circuit block group 36 is turned on, and the second power circuit 35 is turned on. In the state D, the passenger can be provided with both the function for safety use and the function for comfort use.

The control microcomputer 31 acquires the operating states of the first OS 4 and the second OS 5 by the communication C1 with the processor 32, and checks or verify the state specifying table shown in FIG. 4 with the operating states of the integrated drawing ECU 2. In the temporary wake-up state, both the first OS 4 and the second OS 5 are stopped; in the safety use operating state, the first OS 4 is activated while the second OS 5 is stopped; and in the full operating state, both the first OS 4 and the second OS 5 are activated. Therefore, the control microcomputer 31 can determine the operating state of the integrated drawing ECU 2 through the communication C1 with the processor 32. When the control microcomputer 31 specifies the inconsistency between the state specifying table and the operating state of the integrated drawing ECU 2, the control microcomputer 31 shifts the integrated drawing ECU 2 to transition to a suitable state. Further, when the control microcomputer 31 detects an abnormality of the first OS 4 (for example, interruption of periodic communication) in the communication C1 with the processor 32, the control microcomputer 31 forcibly shifts transitions the integrated drawing ECU 2 to a temporary wake-up state.

Next, the state transitions T1 to T7 shown in FIG. 5 will be sequentially described.

(1) State Transition T1

The state transition T1 is a transition from any of a temporary wake-up state, a full operating state, and a safety use operating state, to a power-off state. Suppose the state where the integrated drawing ECU 2 is in any of a temporary wake-up state, a full operating state, and a safety use operating state. In this case, the control microcomputer 31 determines that the input terminal 14 is low and the input terminal 15 is low and thereby causes the integrated drawing ECU 2 to transition from any state to the power-off state (i.e., shifts the integrated drawing ECU 2 from any state to the power-off state). That is, since it becomes difficult for the control microcomputer 31 to maintain the operation as a system, the system is immediately shut down and the integrated drawing ECU 2 is turned off or powered off.

(2) State Transition T2

The state transition T2 is a state transition from the power-off state to the temporary wake-up state. Suppose the state where when the integrated drawing ECU 2 is in the power-off state, the power is supplied from the input terminals 14 and 15. In this case, the control microcomputer 31 causes the integrated drawing ECU 2 to transition from the power-off state to the temporary wake-up state. That is, the control microcomputer 31 shifts the integrated drawing ECU 2 from the power-off state to the temporary wake-up state, and starts controlling the integrated drawing ECU 2. The state transition T2 basically occurs when the integrated drawing ECU 2 is assembled to the vehicle.

(3) State Transition T3

The state transition T3 is a state transition from the full operating state to the temporary wake-up state. When mainly detecting the occurrence of a termination request from the program or an external device, the processor 32 starts the termination process with the program. When the termination process is completed, the processor 32 terminates the communications C5 and C6, and notifies the control microcomputer 31 of the completion of the termination process via the communication C1. Here, in the configuration in which the processor 32 is accompanied by the PMIC (Power Management IC), when the PMIC completes the termination process, the PMIC notifies the control microcomputer 31 of the completion of the termination process via the communication C1. When the processor 32 notifies of the completion of the termination process under the state where the integrated drawing ECU 2 is in the full operating state, the control microcomputer 31 shifts the integrated drawing ECU 2 from the full operating state to the temporary wake-up state. That is, the control microcomputer 31 immediately shuts down the second power circuit 35.

(4) State Transition T4

The state transition T4 is a state transition from the temporarily wake-up state to the safety use operating state. When the control microcomputer 31 detects the occurrence of an activation request in the state where the integrated drawing ECU 2 is in the temporary wake-up state, the control microcomputer 31 shifts the integrated drawing ECU 2 from the temporary wake-up to the safety use operating state. When the control microcomputer 31 causes the integrated drawing ECU 2 to transition from the temporary wake-up state to the full operating state, the second circuit block group 36 may be destroyed unless the processor 32 is activated first before activating the second circuit block group 36. Therefore, instead of directly transitioning from the temporary wake-up state to the full operating state, the transition from the temporary wake-up state to the full operating state via the safety use operating state is performed. That is, the control microcomputer 31 activates the first circuit block group 33 after activating the first OS 4, and activates the second circuit block group 36 after activating the second OS 5.

Figure 6:
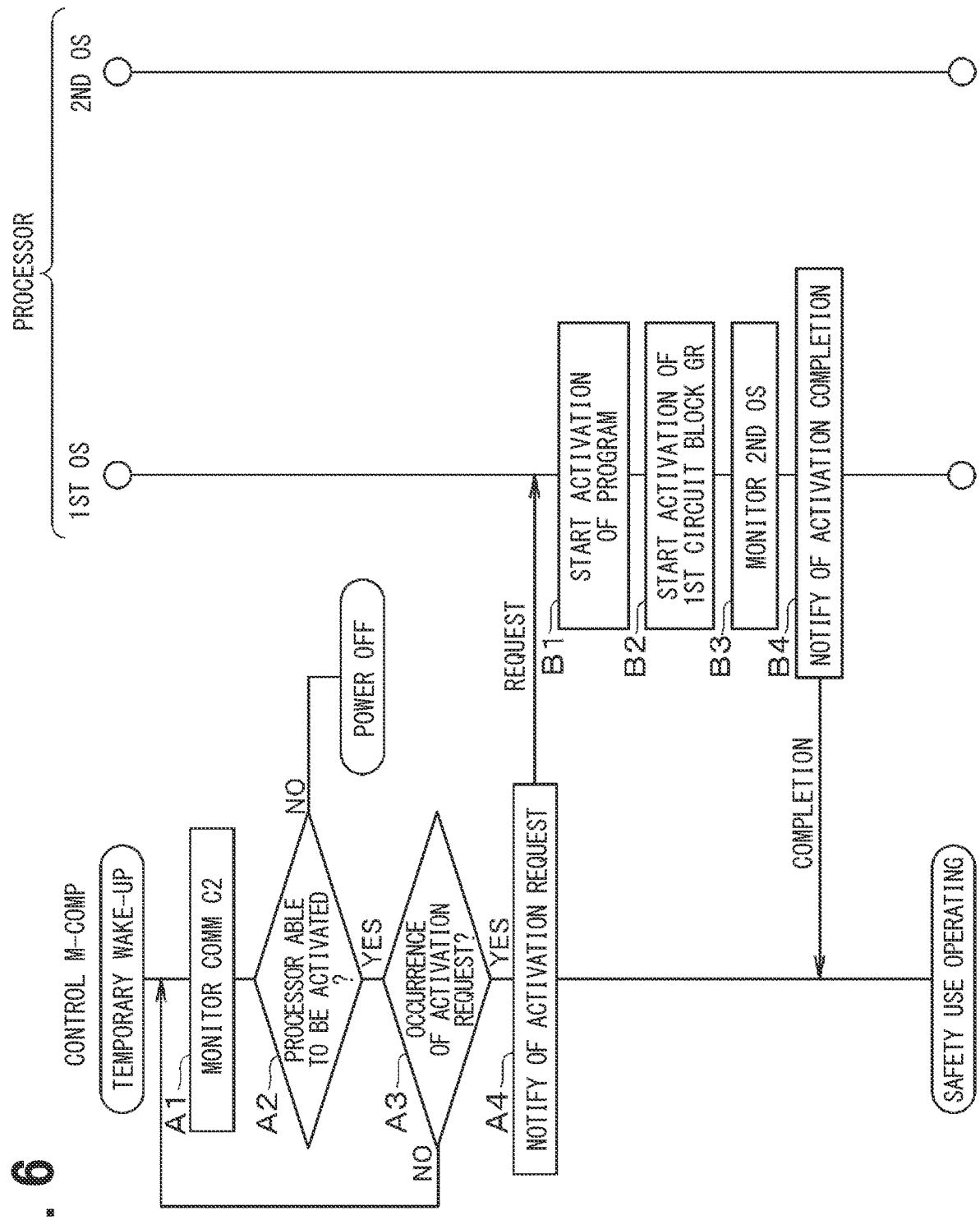
FIG. 6 is a diagram showing a process when transitioning from a temporary activated state to a safety use operating state.

The process when the control microcomputer 31 shifts the integrated drawing ECU 2 from the temporary wake-up state to the safety use operating state will be described with reference to FIG. 6. The control microcomputer 31 monitors the state of the communication C2 at regular time intervals when the integrated drawing ECU 2 is in the temporary wake-up state (A1). The control microcomputer 31 determines the result of monitoring the state of the communication C2 according to the state specifying table, and determines whether or not the processor 32 is able to be activated (A2). When the control microcomputer 31 specifies that the processor 32 is not able to be activated (A2: NO), the control microcomputer 31 shifts the integrated drawing ECU 2 from the temporary wake-up state to the power-off state.

When the control microcomputer 31 specifies that the processor 32 is able to be activated (A2: YES), the control microcomputer 31 monitors the occurrence of an activation request (A3). When the control microcomputer 31 specifies the establishment of the activation condition by the communication C2 and C3 and specifies the occurrence of the activation request (A3: YES), the control microcomputer 31 notifies the processor 32 of the activation request (A4). If the control microcomputer 31 does not specify the occurrence of the activation request within the predetermined time (A3: NO), the control microcomputer 31 times out, returns to step A1, and repeats step A1 and subsequent steps. The case where the activation condition is satisfied by the communication C2 is the case where the VIG is turned on by turning on the engine. The case where the activation condition is satisfied by the communication C3 is the case where an event notification such as ACC being turned on or the door being opened is generated by information such as via CAN. Here, if the PMIC or the like is attached to the processor 32, the control microcomputer 31 may notify the processor 32 of the activation request from the time of transmitting the activation request to the PMIC.

In the processor 32, when the control microcomputer 31 notifies of the activation request, the first OS 4 loads the program from the memory and starts the activation process of the program (B1). When the first OS 4 completes the activation process of the program, the communication C5 is initialized and the activation process of the first circuit block group 33 is started (B2). Further, the first OS 4 monitors the state of the second OS 5 from this point (B3). When the processor 32 completes the activation process of the first circuit block group 33, the processor 32 notifies the control microcomputer 31 of the completion of the activation process (B4).

When the control microcomputer 31 is notified of the completion of the activation process by the processor 32, the control microcomputer 31 shifts the integrated drawing ECU 2 from the temporary wake-up state to the safety use operating state.

(5) State Transition T5

The state transition T5 is a state transition from the safety use operating state to the temporary wake-up state. Suppose the case that when the integrated drawing ECU 2 is in the safety use operating state, it is detected that the operation for safety use is unnecessary by detecting the occurrence of a termination request or the abnormality of the second OS 5 by turning off the ACC, for instance. In this case, the control microcomputer 31 shifts the integrated drawing ECU 2 from the safety use operating state to the temporary wake-up state.

Figure 7:
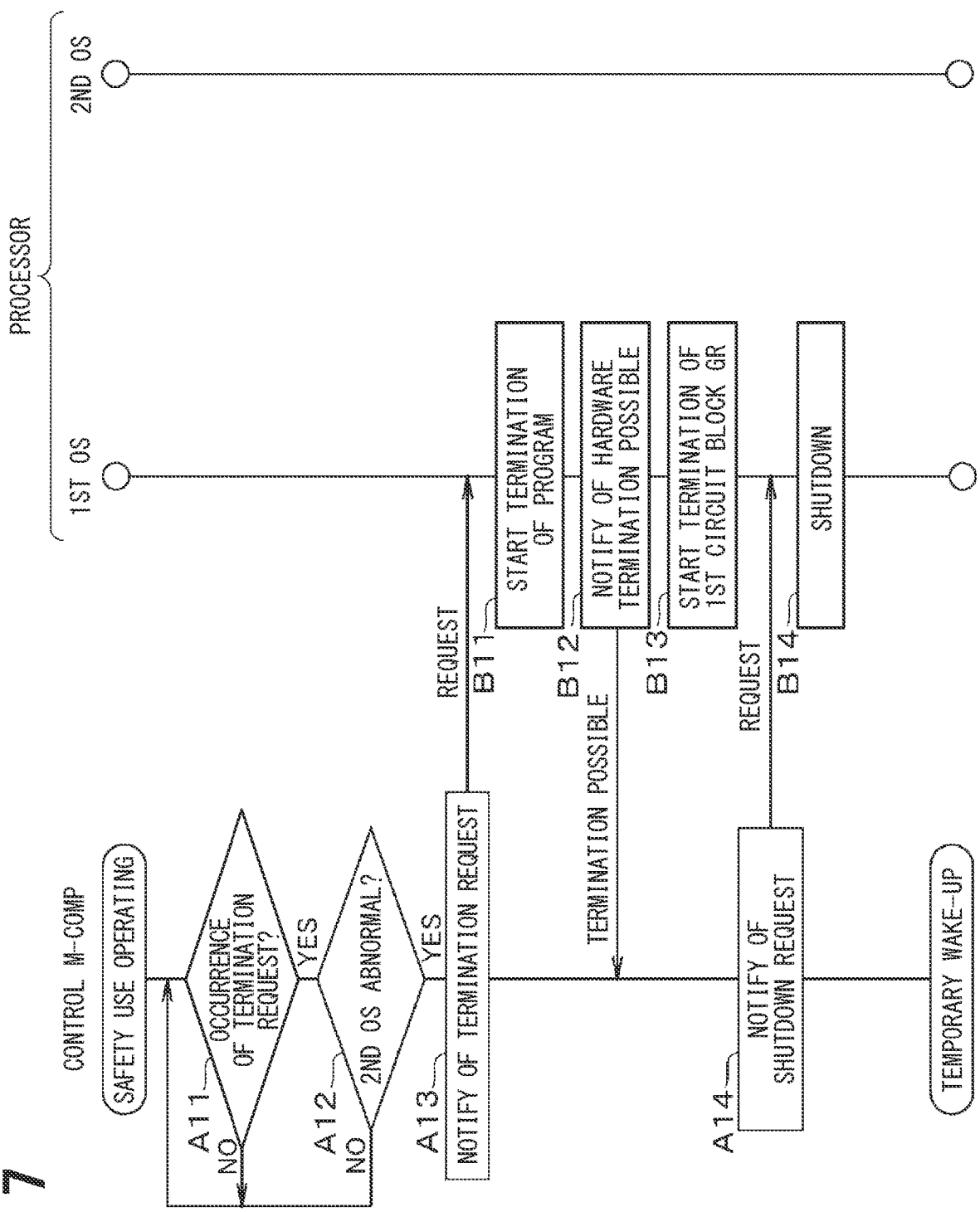
FIG. 7 is a diagram showing a process when transitioning from a safety use operating state to a temporary activated state.

The process when the control microcomputer 31 shifts the integrated drawing ECU 2 from the safety use operating state to the temporary wake-up state will be described with reference to FIG. 7. When the control microcomputer 31 detects the occurrence of a termination request (A11: YES) or detects an abnormality in the second OS 5 (A12: YES) in the safety use operating state, the control microcomputer 31 notifies the processor 32 of the termination request (A13).

In the processor 32, when the control microcomputer 31 notifies of the termination request, the first OS 4 starts the termination process of the program, and, for example, performs backup storage in a memory (B11). When the first OS 4 completes the termination process of the program, it notifies the control microcomputer 31 of the termination process being is possible, indicating that the hardware termination process is possible (B12). Further, when the first OS 4 notifies the control microcomputer 31 of the termination process being possible, the first OS 4 starts the termination process of the first circuit block group 33 (B13).

When the control microcomputer 31 is notified by the processor 32 of the termination process being possible, the control microcomputer 31 notifies the processor 32 of the shutdown request after a certain period of time (A14).

In the processor 32, when the control microcomputer 31 notifies of the shutdown request, the first OS 4 shuts down by turning off all the power (B14). It is noted that when the program determines that shutdown is necessary, the first OS 4 performs step B11 and subsequent steps without being notified of the termination request from the control microcomputer 31.

(6) State Transition T6

The state transition T6 is a state transition from the safety use operating state to the full operating state. After the integrated drawing ECU 2 transitions to the safety use operating state due to some temporary abnormality (for example, temporary contact failure or momentary disconnection of the connector), the abnormality may be resolved. In this case, the control microcomputer 31 shifts the integrated drawing ECU 2 from the safety use operating state to the full operating state.

Figure 8:
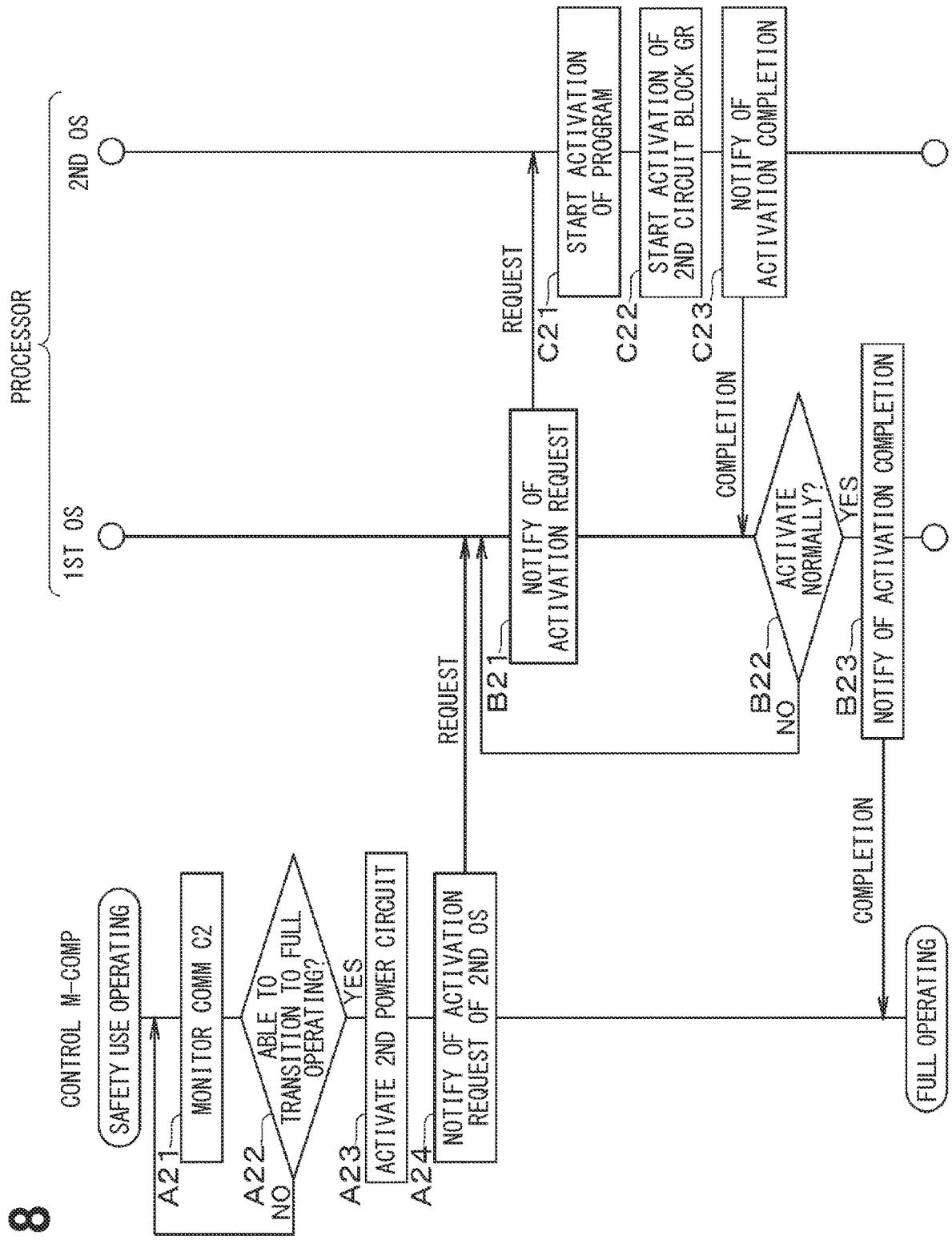
FIG. 8 is a diagram showing a process when transitioning from a safety use operating state to a full operating state.

The process when the control microcomputer 31 shifts the integrated drawing ECU 2 from the safety use operating state to the full operating state will be described with reference to FIG. 8. The control microcomputer 31 monitors the state of the communication C2 at regular time intervals when the integrated drawing ECU 2 is in the safety use operating state (A21). The control microcomputer 31 determines the result of monitoring the state of the communication C2 according to the state specifying table, and determines whether or not the transition to the full operating state is possible (A22). When the control microcomputer 31 specifies that the transition to the full operating state is possible (A22: YES), the control microcomputer 31 activates the second power circuit 35 (A23). When the control microcomputer 31 does not specify that the transition to the full operating state is possible within a predetermined time (A22: NO), the control microcomputer 31 times out, returns to step A21, and repeats step A21 and subsequent steps. When the control microcomputer 31 activates the second power circuit 35, the control microcomputer 31 notifies the processor 32 of the activation request of the second OS 5 (A23).

In the processor 32, when the control microcomputer 31 notifies the activation request of the second OS 5, the first OS 4 notifies the second OS 5 of the activation request (B21). When the second OS 5 is notified by the first OS 4 of the activation request, the second OS 5 loads the program from the memory and starts the activation process of the program (C21). When the second OS 5 completes the activation process of the program, it initializes the communication C6 and starts the activation process of the second circuit block group 36 (C22). When the second OS 5 completes the activation process of the second circuit block group 36, the second OS 5 notifies the first OS 4 of the completion of the activation process (C23).

When the first OS 4 is notified by the second OS 5 of the completion of the activation process, the first OS 4 determines whether or not the second OS 5 has been activated normally (B22). When the first OS 4 specified that the second OS 5 has been activated normally (B22: YES), it notifies the control microcomputer 31 of the completion of the activation process (B23). When the first OS 4 specifies that the second OS 5 has not been activated normally (B22: NO), it returns to step B21 and repeats steps B21 and subsequent steps.

When the control microcomputer 31 is notified by the first OS 4 of the completion of the activation process, the control microcomputer 31 shifts the integrated drawing ECU 2 from the safety use operating state to the full operation.

(7) State Transition T7

The state transition T7 is a state transition from the full operating state to the safety use operating state. When the control microcomputer 31 detects an abnormality in the main power due to a dead battery of the vehicle battery 17 or a disconnection of the main power line 19 in the full operating state, the integrated drawing ECU 2 is shifted from the full operating state to the safety use operating state.

Figure 9:
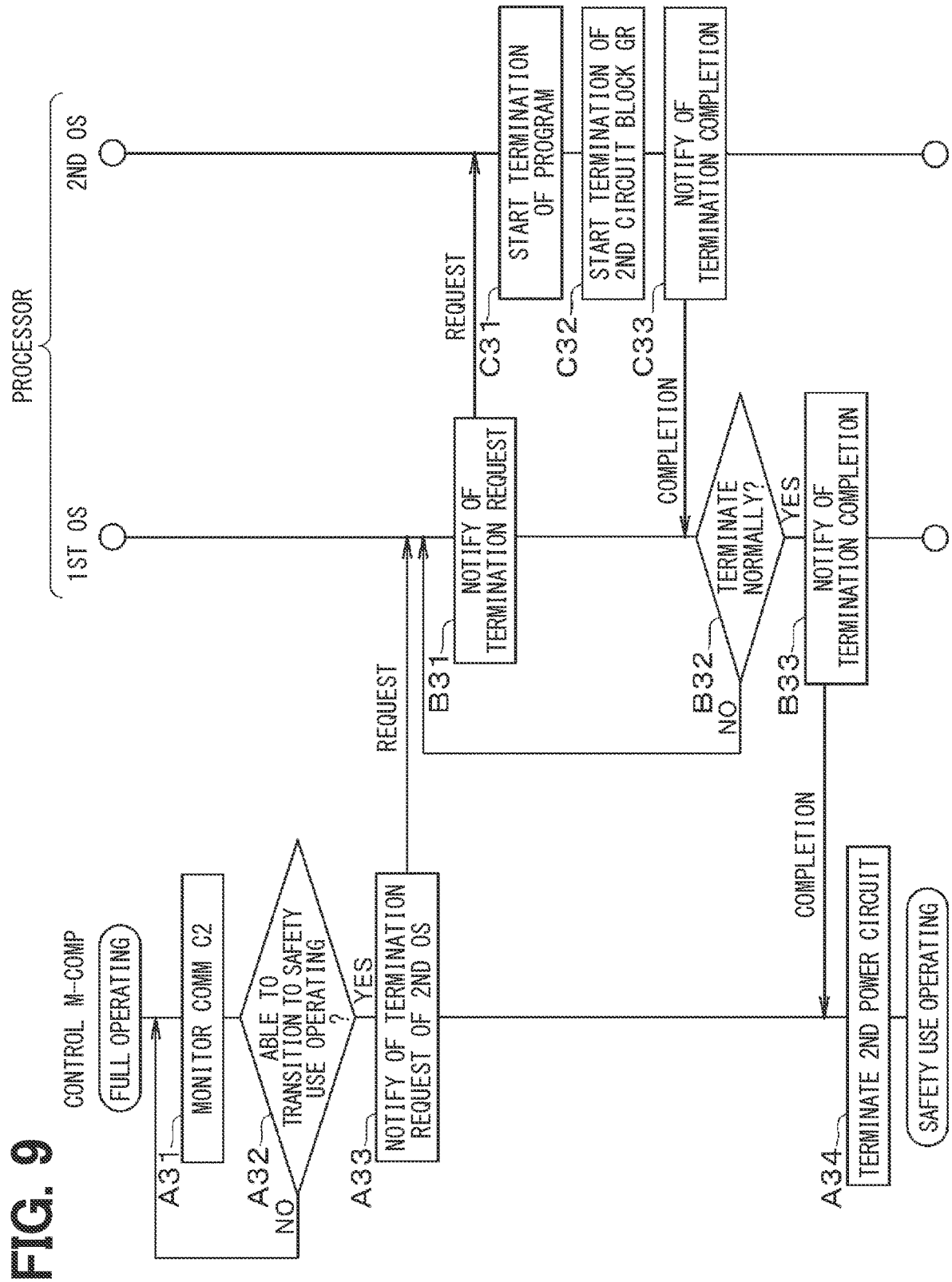
FIG. 9 is a diagram showing a process when transitioning from a full operating state to a safety use operating state.

The process when the control microcomputer 31 shifts the integrated drawing ECU 2 from the full operating state to the safety use operating state will be described with reference to FIG. 9. The control microcomputer 31 monitors the state of the communication C2 at regular time intervals when the integrated drawing ECU 2 is in the full operating state (A31). The control microcomputer 31 determines the result of monitoring the state of the communication C2 according to the state specifying table, and determines whether or not the transition to the safety use operating state is possible (A32). When the control microcomputer 31 specifies that the transition to the safety use operating state is possible (A32: YES), the control microcomputer 31 notifies the processor 32 of the termination request of the second OS 5 (A33).

In the processor 32, when the first OS 4 is notified by the control microcomputer 31 of the termination request of the second OS 5, the first OS 4 notifies the second OS 5 of the termination request (B31). In response to being notified of the termination request from the first OS 4, the second OS 5 starts the termination process of the program (C31). For example, backup storage to a memory is performed, and termination process of the second circuit block group 36 is started (C32). When the termination process of the program and the termination process of the second circuit block group 36 are completed, the second OS 5 notifies the first OS 4 of the completion of the termination process (C33).

When the first OS 4 is notified by the second OS 5 of the completion of the termination process, the first OS 4 determines whether or not the second OS 5 has terminated normally (B32). When the first OS 4 specified that the second OS 5 has been normally terminated (B32: YES), the first OS 4 notifies the control microcomputer 31 of the completion of the termination process (B33). When the first OS 4 specified that the second OS 5 has not been normally terminated (B32: NO), it returns to step B31 and repeats steps B31 and subsequent steps.

When the control microcomputer 31 is notified by the first OS 4 of the completion of the termination process, the control microcomputer 31 terminates the operation of the second power circuit 35 (A34), and shifts the integrated drawing ECU 2 from the full operation to the safety use operating state.

The present embodiment as described above produces the following operational effects. By separating the first power circuit 30 and the second power circuit 35 from each other in the integrated drawing ECU 2, leakage current to the second circuit block group 36 and unnecessary power consumption in the second power circuit 35 are prevented from occurring. As a result, it is possible to appropriately maintain the drawing of information on safety use by the sub power while appropriately reducing unnecessary power consumption in the event of an abnormality in the main power without incurring high costs.

Further, in the integrated drawing ECU 2, the first OS 4 is layered or located above the second OS 5, so as to monitor the state of the second OS 5. The second OS 5 can be activated by being notified of the activation request by the first OS 4; the second OS 5 can be terminated by being notified of the termination request by the first OS 4.

Further, in the integrated drawing ECU 2, the first circuit block group 33 is activated after the first OS 4 is activated. If the first circuit block group 33 is activated before the first OS 4 is activated, the first circuit block group 33 may be destroyed. However, by activating the first circuit block group 33 after activating the first OS 4, it is possible to avoid the possibility of such destruction.

Further, in the integrated drawing ECU 2, the second circuit block group 36 is activated after the second OS 5 is activated. If the second circuit block group 36 is activated before the second OS 5 is activated, the second circuit block group 36 may be destroyed. However, by activating the second circuit block group 36 after activating the second OS 5, it is possible to avoid the possibility of such destruction.

While the present disclosure has been described based on the embodiment, the present disclosure is not limited to the embodiment or structure described herein. The present disclosure encompasses various modifications and variations within the scope of equivalents. Additionally, various combinations and configurations, as well as other combinations and configurations including more, less, or only a single element, are within the scope and spirit of the present disclosure.

The controller or controller circuit and the method thereof described in the present disclosure may be implemented (i) by (a) a first special-purpose computer provided by configuring a processor and a memory programmed to execute one or more functions embodied by a computer program product, or (ii) by (b) a second special-purpose computer provided by configuring a processor with one or more special-purpose hardware logic circuits, or (iii) any combination of (a) the first special-purpose computer provided by configuring the processor and the memory and (b) the second special-purpose computer provided by configuring the processor with one or more special-purpose hardware logic circuits. The computer program may also be stored on a computer readable non-transitory tangible recording medium as instructions to be executed by a computer.

For reference to further explain features of the present disclosure, the description is added as follows.

Vehicles (for example, automobiles) are equipped with many electronic control units (ECUs). These electronic control units perform various controls in cooperation with others. Some of these electronic control units are used to improve safety in operations. Those electronic control units need to maintain their operations by the power from the auxiliary battery via the sub power line, even if an abnormality occurs in the vehicle battery or the main power line from the vehicle battery. That is, some electronic control units mounted on the vehicle need to be maintained in operation by the power supplied from the sub power even when the main power is abnormal.

There is proposed a vehicular drawing device to diversify the information presented to the passenger by switching information on safety use and information on comfort use to draw both in combination. For example, the information on safety use includes information on meter displays, information on sensors and communications for automatic driving, and information on warnings. The information on comfort use includes information on TVs and information on applications linked to smartphones held by passengers.

This type of vehicular drawing device thus has a requirement of continuing to maintain both drawing the information on safety use and drawing the information on comfort use even when the main power is abnormal, as described above, under the harsh environment of the vehicle. It is however difficult to achieve such a requirement in that the capacity of the auxiliary battery and the current rating of each power line need to be satisfied. That is, when the main power is abnormal, it is desired that the drawing of the information on safety use be prioritized over the drawing of the information on comfort use, and the drawing of the information on safety use by the sub power be maintained for a long time.

In order to maintain the drawing of information on safety use by the sub power, the current consumption can be reduced by disconnecting the enable signal of the circuit block group used for drawing information on comfort use. Suppose a configuration in which the power circuit that supplies power to the circuit block group for safety use and the power circuit that supplies power to the circuit block group for comfort use are common. In such a configuration, even if the enable signal is disconnected, leakage current to the circuit block group for comfort use and unnecessary power consumption in the power circuit occur. Therefore, the period of time during which the drawing of information on safety use by the sub power is maintained is reduced due to the unnecessary power consumption. On the other hand, if an auxiliary battery having a relatively high capacity is adopted, it is considered that the drawing of information on safety use by the sub power can be maintained for a long time. However, if the capacity of the auxiliary battery is increased, there is a concern that the cost will increase.

It is thus desired to provide a configuration in which information on safety use and information on comfort use are drawn in an integrated manner. Such a configuration can properly maintain the drawing of information on safety use by the sub power while appropriately reducing unnecessary power consumption at the occurrence of an abnormality in the main power without incurring high costs.

An aspect of the present disclosure described herein is set forth in the following clauses.

According to an aspect of the present disclosure, a vehicular drawing device is provided to include a first operating system, a second operating system, a first circuit block group, a second circuit block group, a first power circuit, a second power circuit, and a controller circuit. The first operating system is configured to provide a first function. The second operating system is configured to provide a second function. The first circuit block group is used in the first operating system. The second circuit block group is used in the second operating system. The first power circuit is configured to supply a sub power to the first circuit block group. The second power circuit is provided separately from the first power circuit, and the second power circuit is configured to supply a main power to the second circuit block group. The controller circuit is configured to (i) maintain supplying of the sub power from the first power circuit to the first circuit block group and (ii) terminate an operation of the second power circuit, in response to the main power being abnormal.

By separating the first power circuit and the second power circuit from each other, it is possible to avoid (i) leakage current to the second circuit block group and (ii) occurrence of unnecessary power consumption in the second power circuit. The first operating system is provided to be an operating system that provides functions for safety use, and the second operating system is provided to be an operating system that provides functions for comfort use. As a result, it is possible to appropriately maintain the drawing of information on safety use by the sub power while appropriately reducing unnecessary power consumption at the occurrence of an abnormality in the main power, without incurring high costs.

What is claimed is:

1. A vehicular drawing device operated on an electronic control unit comprising:
    a first operating system configured to provide a first function;
    a second operating system configured to provide a second function;
    a first circuit block group used in the first operating system;
    a second circuit block group used in the second operating system;
    a first power circuit configured to supply a sub power to the first circuit block group;
    a second power circuit provided separately from the first power circuit, the second power circuit being configured to supply a main power to the second circuit block group; and
    a controller circuit configured to (i) maintain supplying of the sub power from the first power circuit to the first circuit block group and (ii) terminate an operation of the second power circuit, in response to the main power being abnormal, wherein
    the first operating system is provided to be a primary layer above the second operating system as a secondary layer to monitor a state of the second operating system,
    the first operating system notifies the second operating system of an activation request to activate the second operating system, and
    the first operating system notifies the second operating system of a termination request to terminate the second operating system.

2. The vehicular drawing device according to claim 1, wherein:
    the first operating system is an operating system configured to provide a function for safety use; and
    the second operating system is an operating system configured to provide a function for comfort use.

3. The vehicular drawing device according to claim 1, further comprising:
    a detector circuit configured to detect a voltage of each of a plurality of power lines, wherein:
    the controller circuit is configured to identify an abnormality in the main power according to a detection result by the detector.

4. The vehicular drawing device according to claim 1, wherein:
    the controller circuit configured to activate the first circuit block group after activating the first operating system.

5. The vehicular drawing device according to claim 1, wherein:
    the controller circuit configured to activate the second circuit block group after activating the second operating system.

6. The vehicular drawing device according to claim 1, wherein:
    the first operating system is provided to monitor a state of the second operating system.

7. The vehicular drawing device according to claim 1, further comprising:
    a memory configured to store the first operating system and the second operating system.

8. A vehicular drawing device operated on an electronic control unit comprising:
    a memory configured to store a first operating system configured to provide a first function, and a second operating system configured to provide a second function;
    a first circuit block group used in the first operating system;
    a second circuit block group used in the second operating system;
    a first power circuit configured to supply a sub power to the first circuit block group;
    a second power circuit provided separately from the first power circuit, the second power circuit being configured to supply a main power to the second circuit block group; and
    a controller circuit configured to (i) maintain supplying of the sub power from the first power circuit to the first circuit block group and (ii) terminate an operation of the second power circuit, in response to the main power being abnormal, wherein
    the first operating system is provided to be a primary layer above the second operating system as a secondary layer to monitor a state of the second operating system,
    the first operating system notifies the second operating system of an activation request to activate the second operating system, and
    the first operating system notifies the second operating system of a termination request to terminate the second operating system.

* * * * *